(12) United States Patent
Hung et al.

(10) Patent No.: US 11,785,730 B2
(45) Date of Patent: Oct. 10, 2023

(54) FOLDABLE ELECTRONIC DEVICE INCLUDING A CHAIN AND AT LEAST ONE ELASTIC PADDING

(71) Applicant: TPK Advanced Solutions Inc., Fujian (CN)

(72) Inventors: Po-Pin Hung, Kinmen County (TW); Tu Teng Shen, Xiamen (CN); Xin Chang Lai, Longyan (CN); Po-Wen Chen, Hualien County (TW); Qing Hui Lu, Xiamen (CN)

(73) Assignee: TPK Advanced Solutions Inc., Fujian (CN)

( * ) Notice: Subject to any disclaimer, the term of this patent is extended or adjusted under 35 U.S.C. 154(b) by 9 days.

(21) Appl. No.: 17/386,640

(22) Filed: Jul. 28, 2021

(65) Prior Publication Data
US 2023/0031086 A1     Feb. 2, 2023

(51) Int. Cl.
*H05K 5/02*     (2006.01)

(52) U.S. Cl.
CPC .................................. *H05K 5/0226* (2013.01)

(58) Field of Classification Search
CPC ... H05K 5/0226; G06F 1/1681; G06F 1/1652; G06F 1/1637; G06F 1/1633
See application file for complete search history.

(56) References Cited

U.S. PATENT DOCUMENTS

| | | | |
|---|---|---|---|
| 9,243,432 B2 * | 1/2016 | Lee | E05D 5/10 |
| 9,625,953 B2 * | 4/2017 | Bitz | H04M 1/0216 |
| 9,625,954 B2 * | 4/2017 | Campbell | E05D 7/12 |
| 9,891,725 B2 * | 2/2018 | Lindblad | H10K 59/40 |
| 9,910,465 B2 * | 3/2018 | Tazbaz | H04M 1/0216 |
| 10,032,391 B2 * | 7/2018 | Kim | G06F 1/1641 |
| 10,162,389 B2 * | 12/2018 | Tazbaz | H04M 1/022 |
| 10,174,534 B2 * | 1/2019 | Tazbaz | G06F 1/1616 |
| 10,407,955 B2 * | 9/2019 | Kessler | G06F 1/163 |
| 10,437,293 B2 * | 10/2019 | Bitz | E05D 1/04 |
| 2007/0117600 A1 * | 5/2007 | Robertson, Jr. | G06F 1/1681 455/575.1 |
| 2012/0307423 A1 * | 12/2012 | Bohn | H04M 1/0216 361/679.01 |
| 2014/0126133 A1 * | 5/2014 | Griffin | G06F 1/1652 312/326 |
| 2015/0055287 A1 * | 2/2015 | Seo | G06F 1/1641 361/679.27 |
| 2015/0077917 A1 * | 3/2015 | Song | G06F 1/1652 361/679.27 |
| 2015/0131222 A1 * | 5/2015 | Kauhaniemi | H04M 1/0268 16/225 |

(Continued)

FOREIGN PATENT DOCUMENTS

| | | |
|---|---|---|
| CN | 106463079 B | 2/2017 |
| CN | 106486018 B | 3/2017 |
| CN | 109058284 A | 12/2018 |

*Primary Examiner* — Rockshana D Chowdhury
*Assistant Examiner* — Douglas R Burtner
(74) *Attorney, Agent, or Firm* — Cooper Legal Group, LLC

(57) ABSTRACT

A foldable electronic device includes a frame, a flexible component disposed on the frame, and a hinge device. The hinge device includes a chain and at least one elastic padding. The chain is connected to the frame and includes a plurality of chain units. The elastic padding is disposed in at least one of the chain units or encapsulates at least one of the chain units.

20 Claims, 12 Drawing Sheets

(56) References Cited

U.S. PATENT DOCUMENTS

| | | | | |
|---|---|---|---|---|
| 2015/0277506 A1* | 10/2015 | Cheah | .................. | G06F 1/1662 |
| | | | | 361/679.28 |
| 2016/0239046 A1* | 8/2016 | Park | ...................... | G04G 17/08 |
| 2018/0110139 A1 | 4/2018 | Seo et al. | | |
| 2022/0007528 A1* | 1/2022 | Kim | ...................... | H10K 50/84 |
| 2022/0250475 A1* | 8/2022 | Buth | .................... | G06F 1/1641 |

* cited by examiner

FOLDABLE ELECTRONIC DEVICE INCLUDING A CHAIN AND AT LEAST ONE ELASTIC PADDING

BACKGROUND

Technical Field

The present disclosure relates to a foldable electronic device.

Description of Related Art

In recent years, foldable electronic devices have drawn considerable attention. Advantages of foldable electronic devices include being easier to carry (since a foldable electronic device can be folded to reduce its size) and having larger display size (compared to non-foldable devices). However, the hinges found in commercially available foldable electronic devices have a complex structure and lack waterproof and dustproof capability.

For example, the published patents CN106486018B and CN106463079B both mention connecting structures for a hinge and using elastic material for connection in a hinge, yet still fail to make the hinge waterproof and dustproof.

SUMMARY

In view of the foregoing, one of the objects of the present disclosure is to provide a foldable electronic device with a hinge having a simple structure and being waterproof and dustproof.

To achieve the objective stated above, in accordance with an embodiment of the present disclosure, a foldable electronic device includes a frame, a flexible component disposed on the frame, and a hinge device. The hinge device includes a chain and at least one elastic padding. The chain is connected to the frame and includes a plurality of chain units. The chain units include a first chain unit and a second chain unit. The first chain unit includes a first pivot portion, and the second chain unit includes a second pivot portion movably connected to the first pivot portion. The first chain unit has a recess for receiving the second pivot portion. The elastic padding is disposed at least one of in the recess of the first chain unit or between the first pivot portion and the second pivot portion.

In one or more embodiments of the present disclosure, the first pivot portion includes a pin extending through the second pivot portion. The elastic padding at least partially covers a surface of the second pivot portion away from the pin.

In one or more embodiments of the present disclosure, the second pivot portion has an opening. The first pivot portion includes a pin rotatably and slidably located in the opening. The elastic padding fills in the opening and wraps around the pin.

In one or more embodiments of the present disclosure, the first pivot portion has an opening located on a sidewall of the recess. The second pivot portion includes an extending structure and a protrusion. The extending structure extends into the recess. The protrusion is disposed on a side of the extending structure and is rotatably and slidably located in the opening. The elastic padding is configured to at least one of cover an end of the extending structure or fill in the opening and wrap around the protrusion.

In one or more embodiments of the present disclosure, the hinge device includes a plurality of elastic paddings. Each of the elastic paddings is disposed in one of the chain units, and the elastic paddings are spaced apart from one another.

In accordance with an embodiment of the present disclosure, a foldable electronic device includes a frame, a flexible component disposed on the frame, and a hinge device. The hinge device includes a chain and at least one elastic padding. The chain is connected to the frame and includes a plurality of chain units. The elastic padding encapsulates at least one of the chain units and includes one or more organic polymer material.

In one or more embodiments of the present disclosure, the chain units include a first chain unit and a second chain unit. The first chain unit has a thru-hole. The second chain unit extends through the thru-hole. The elastic padding covers a surface of the first chain unit away from the thru-hole and fills in the thru-hole.

In accordance with an embodiment of the present disclosure, a foldable electronic device includes a frame, a flexible component disposed on the frame, and a hinge device. The hinge device includes a shaft, a rotating component, a sliding component, a chain, and at least one elastic padding. The rotating component is rotatably connected to the shaft. The sliding component is slidably disposed on the rotating component and is connected to the frame. The chain is connected to the sliding component and includes a plurality of chain units. The elastic padding is disposed in at least one of the chain units or encapsulates at least one of the chain units.

In one or more embodiments of the present disclosure, the chain units include a first chain unit and a second chain unit. The first chain unit has a recess. The second chain unit is at least partially located in the recess. The elastic padding fills in the recess.

In one or more embodiments of the present disclosure, the first chain unit includes a first pivot portion. The second chain unit includes a second pivot portion movably connected to the first pivot portion and at least partially located in the recess. The elastic padding at least partially covers the second pivot portion.

In one or more embodiments of the present disclosure, the chain units include a first chain unit and a second chain unit. The first chain unit includes a first pivot portion. The second chain unit includes a second pivot portion movably connected to the first pivot portion. The elastic padding is disposed between the first pivot portion and the second pivot portion.

In one or more embodiments of the present disclosure, the second pivot portion extends around the first pivot portion and the elastic padding wraps around the first pivot portion, or the second pivot portion extends through the first pivot portion and is covered by the elastic padding.

In one or more embodiments of the present disclosure, the chain units include a first chain unit having a thru-hole and a second chain unit extending through the thru-hole. The elastic padding encapsulates the first chain unit and the second chain unit and fills in the thru-hole.

In one or more embodiments of the present disclosure, the elastic padding includes one or more organic polymer material.

In one or more embodiments of the present disclosure, the chain units of the chain are categorized into at least a first group and a second group. The chain units of the first group are positioned around the shaft when the foldable electronic device is folded. The second group adjoins the first group. The hinge device includes a first elastic padding and a second elastic padding. The first elastic padding is disposed in or encapsulates the chain units of the first group. The second elastic padding is disposed in or encapsulates the chain units of the second group. An elastic modulus of the first elastic padding is lower than an elastic modulus of the second elastic padding.

In one or more embodiments of the present disclosure, the chain units of the chain are categorized into the first group, the second group, and a third group. The second group is located between the first group and the third group. The hinge device includes a third elastic padding. The third elastic padding is disposed in or encapsulates the chain units of the third group. An elastic modulus of the third elastic padding is lower than the elastic modulus of the second elastic padding and is higher than the elastic modulus of the first elastic padding.

In one or more embodiments of the present disclosure, the flexible component includes a flexible display panel or a flexible cover plate.

In sum, the foldable electronic device of the present disclosure includes a hinge device having a chain and at least one elastic padding, with the elastic padding being disposed in part or all of the chain or encapsulating part or all of the chain. This simple structure enables the hinge device to guide the folding and unfolding of the flexible component of the foldable electronic device (e.g., a flexible display panel or a flexible cover plate). In addition, the elastic padding can block particles and moisture from entering the chain, thereby prolonging the lifespan of the hinge device.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

DETAILED DESCRIPTION

Figure 1:
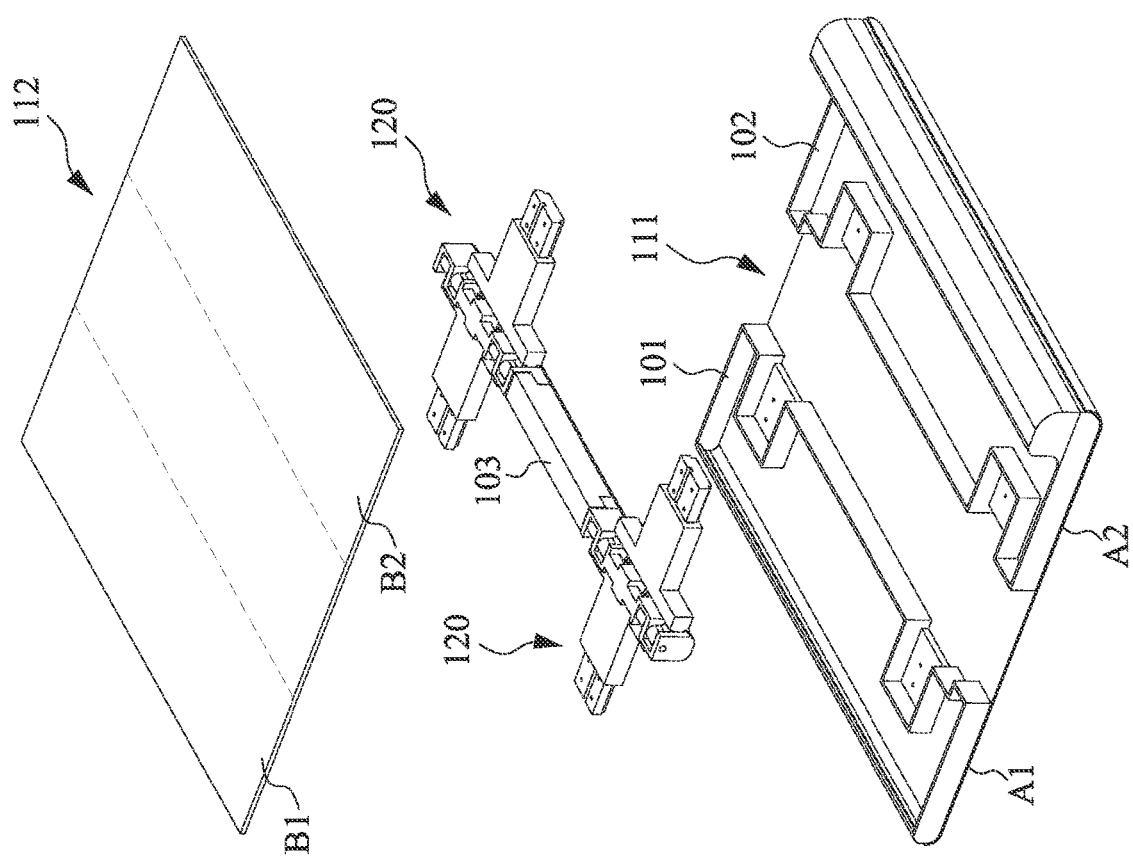
FIG. 1 illustrates an exploded view of a foldable electronic device in accordance with an embodiment of the present disclosure, in which the foldable electronic device is unfolded.

For the completeness of the description of the present disclosure, reference is made to the accompanying drawings and the various embodiments described below. Various features in the drawings are not drawn to scale and are provided for illustration purposes only. To provide a full understanding of the present disclosure, various practical details will be explained in the following descriptions. However, a person with ordinary skill in the relevant art should realize that the present disclosure can be implemented without one or more of the practical details. Therefore, the present disclosure is not to be limited by these details.

Figure 2:
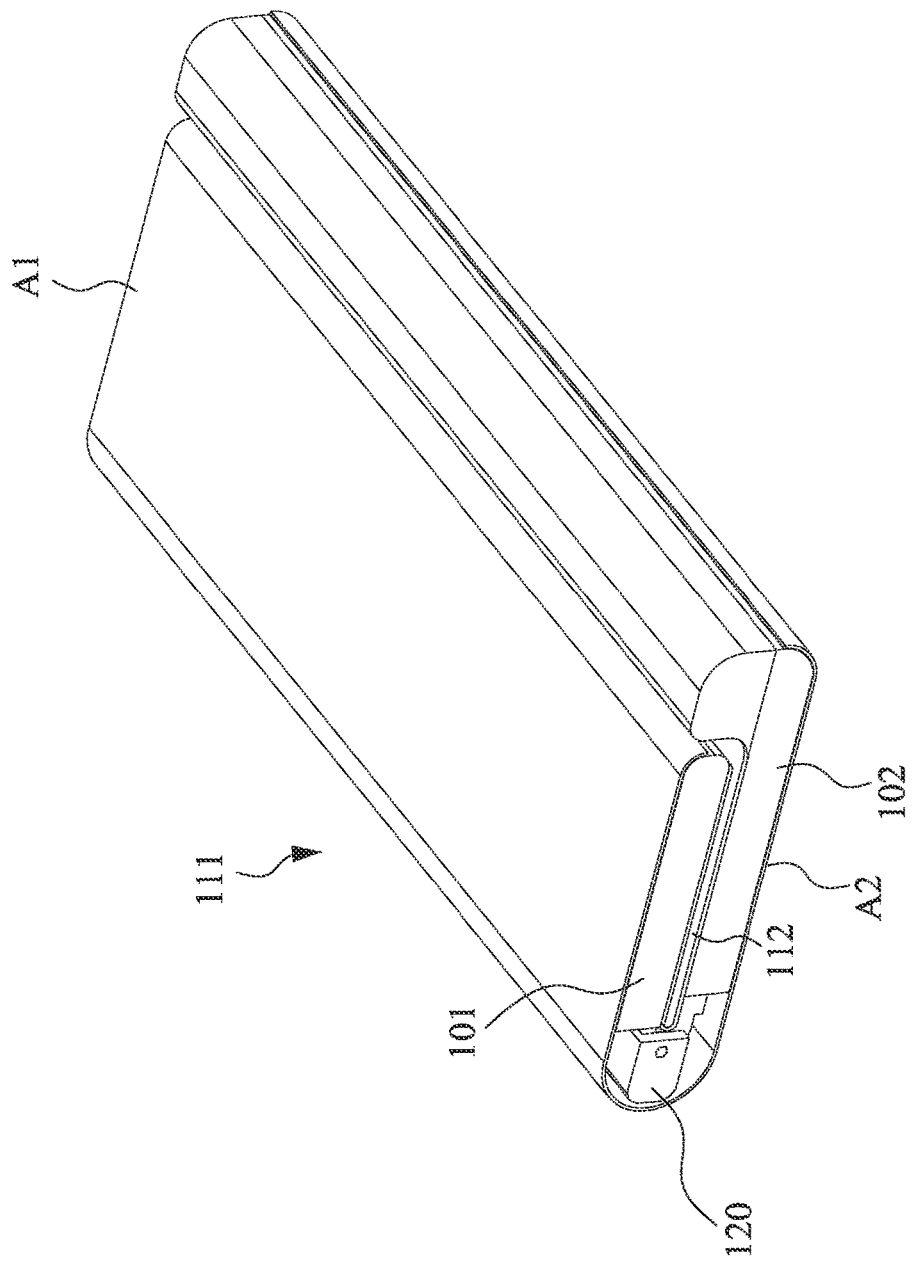
FIG. 2 illustrates an assembled view of the foldable electronic device shown in FIG. 1, in which the foldable electronic device is folded.

Reference is made to FIGS. 1 and 2. A foldable electronic device 100 includes two frames 101 and 102, two flexible components 111 and 112, and at least one hinge device 120. The two frames 101 and 102 are arranged side by side. The flexible components 111 and 112 are disposed on the frames 101 and 102, and the flexible components 111 and 112 are located on opposite sides of the frames 101 and 102. The hinge device 120 is connected to the two frames 101 and 102 and is located between the flexible components 111 and 112. The frames 101 and 102 may be rotated relative to each other under the support of the hinge device 120, so as to fold or unfold the flexible components 111 and 112.

As shown in FIGS. 1 and 2, in some embodiments, the foldable electronic device 100 includes two hinge devices 120 connected by a rod 103. In some embodiments, one of the flexible components 111 and 112 includes a flexible display panel (e.g., a flexible organic light emitting diode (OLED) display panel), and another includes a flexible display panel or a flexible cover plate. In some embodiments, the flexible components 111 and 112 may be fixed to the frames 101 and 102 using fasteners such as screws or using adhesives.

As shown in FIGS. 1 and 2, in some embodiments, the flexible component 111 includes a first region A1 and a second region A2. The first region A1 is attached to the frame 101, and the second region A2 is attached to the frame 102. The foldable electronic device 100 may be unfolded or folded. An angle between the first region A1 and the second region A2 changes as the foldable electronic device 100 is unfolded or folded. When the foldable electronic device 100 is unfolded, the angle between the first region A1 and the second region A2 of the flexible component 111 is substantially 180 degrees. When the foldable electronic device 100 is folded, the first region A1 and the second region A2 of the flexible component 111 are in a stack arrangement.

In some embodiments, the flexible component 112 includes a first region B1 and a second region B2, the configurations of which are similar to the first region A1 and the second region A2 of the flexible component 111.

Figure 3:
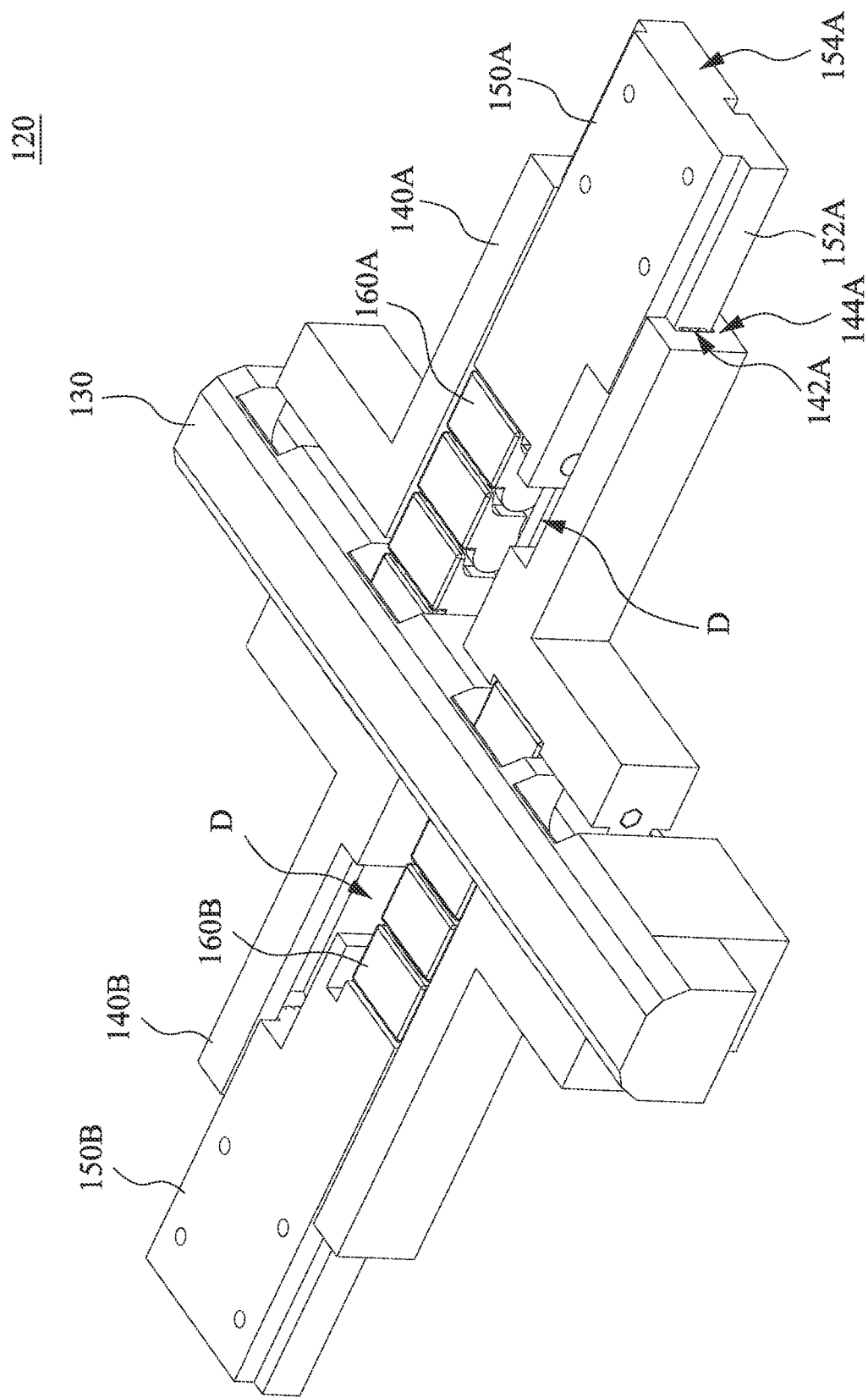
FIGS. 3 and 4 respectively show a hinge device of the foldable electronic device of FIG. 1 being unfolded and folded.
Figure 4:
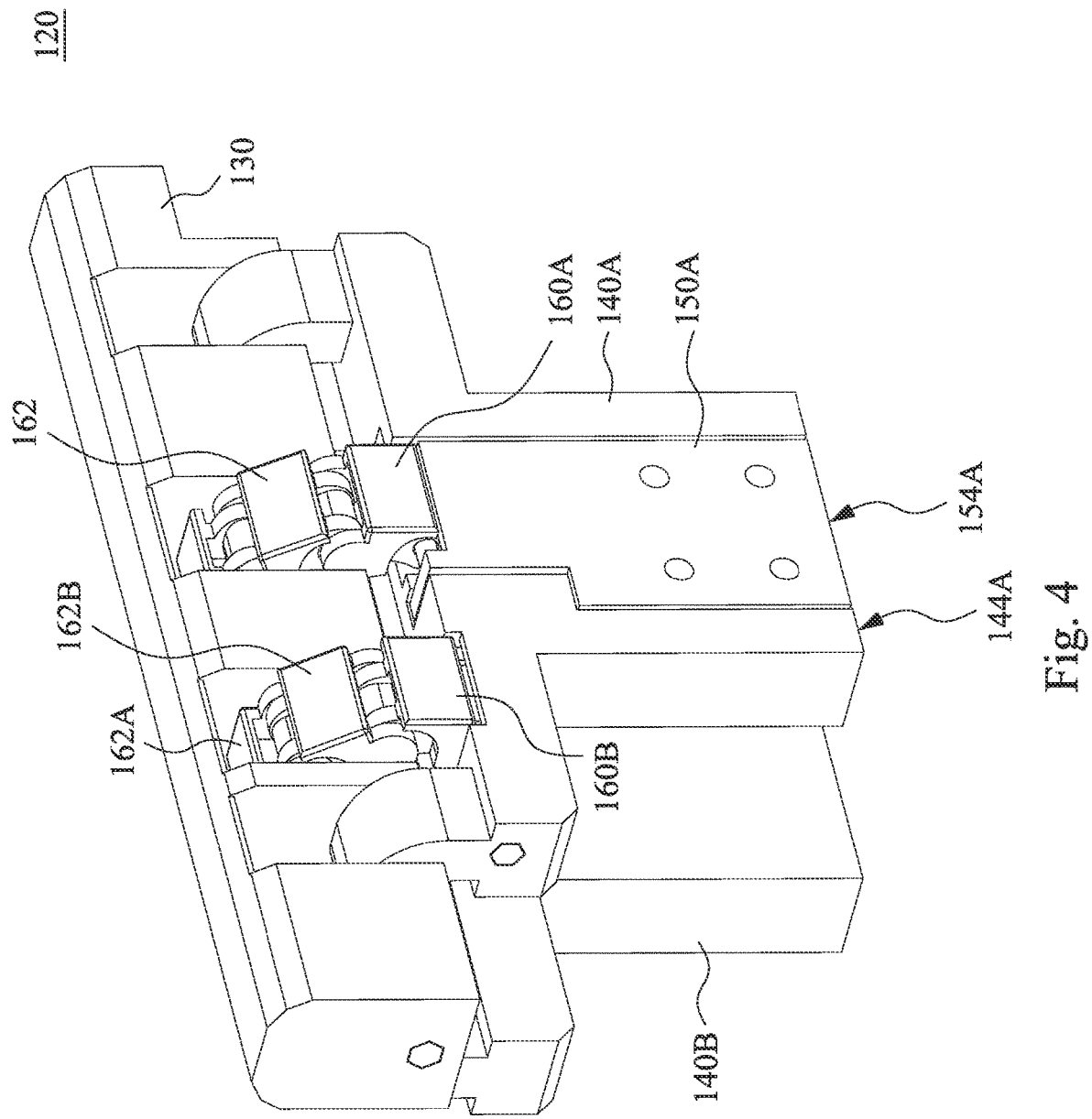

Reference is made to FIGS. 3 and 4. In addition to supporting the rotation of the frames 101 and 102, the hinge device 120 may adjust the radial positions of the frames 101 and 102 as the angle between the two frames 101 and 102 changes via rotation, so as to facilitate the folding and unfolding of the flexible components 111 and 112. Specifically, the hinge device 120 includes a shaft 130, a rotating component 140A, a sliding component 150A, and a chain 160A. The rotating component 140A is rotatably connected to the shaft 130. The sliding component 150A is slidably disposed on the rotating component 140A and is configured to rotate with the rotating component 140A around the shaft 130. The frame 101 is fixedly attached to the sliding component 150A and thus moves together with the sliding component 150A. The chain 160A is connected to the sliding component 150A. The chain 160A is a length-adjustable structure. The chain 160A may drive the sliding component 150A to slide on the rotating component 140A as the angle between the two frames 101 and 102 changes via rotation.

As shown in FIGS. 3 and 4, in some embodiments, the rotating component 140A has a recess D for receiving the sliding component 150A. In some embodiments, the rotating component 140A has a slot 142A on at least one sidewall of the recess D, and the sliding component 150A includes a rail 152A slidably connected to the slot 142A.

As shown in FIGS. 3 and 4, in some embodiments, the rotating component 140A has an end surface 144A. The end surface 144A is located on a side of the rotating component 140A away from the shaft 130. The sliding component 150A has an end surface 154A. The end surface 154A is located on a side of the sliding component 150A away from the shaft 130. The hinge device 120 may be unfolded or folded. When the hinge device 120 is unfolded, the sliding component 150A protrudes from the rotating component 140A (i.e., a distance from the end surface 154A of the sliding component 150A to the shaft 130 is greater than a distance from the end surface 144A of the rotating component 140A to the shaft 130). When the hinge device 120 is folded, the sliding component 150A retracts into the rotating component 140A (i.e., the end surface 154A of the sliding component 150A is aligned with the end surface 144A of the rotating component 140A.

As shown in FIGS. 3 and 4, in some embodiments, the hinge device 120 further includes a rotating component 140B, a sliding component 150B, and a chain 160B, in which the sliding component 150B is connected to the frame 102. When the hinge device 120 is unfolded, the two rotating components 140A and 140B are located on opposite sides of the shaft 130. The mechanical structure of the rotating component 140B, the sliding component 150B, and the chain 160B may be similar to that of the rotating component 140A, the sliding component 150A, and the chain 160A. Thus, the foregoing discussions about the rotating component 140A, the sliding component 150A, and the chain 160A may apply to the rotating component 140B, the sliding component 150B, and the chain 160B as well.

As shown in FIGS. 3 and 4, in some embodiments, the chains 160A and 160B extend through the shaft 130. In some embodiments, the chain 160A is connected to the sliding component 150A, and the chain 160B is connected to the sliding component 150B.

Figure 5:
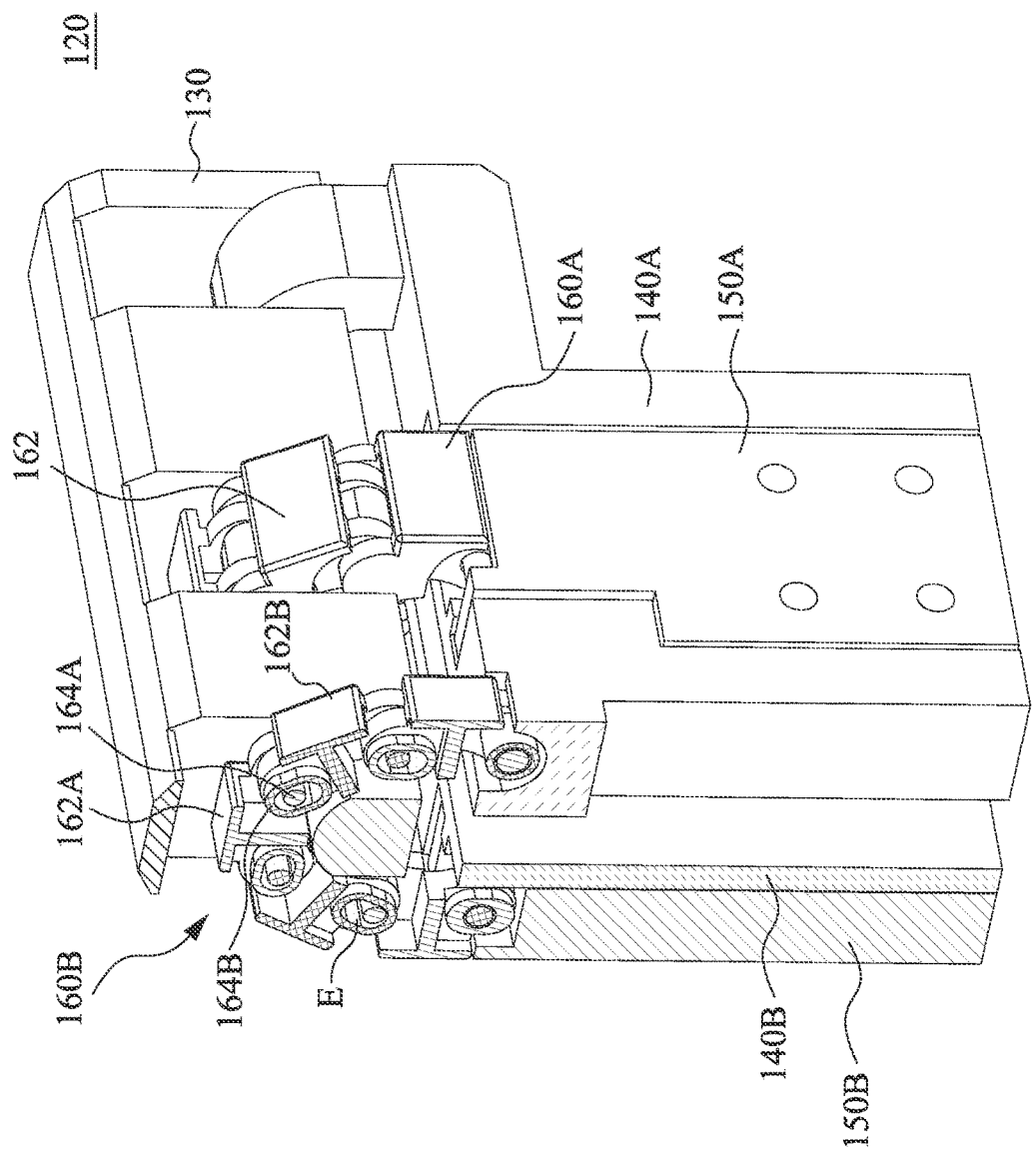
FIG. 5 illustrates a sectional view of the hinge device shown in FIG. 4.

Reference is made to FIGS. 4 and 5. The chains 160A and 160B may each include a plurality of chain units 162. Any two immediately adjacent chain units 162 are pivotably and movably connected to the each other. Specifically, the chain 160B includes a first chain unit 162A and a second chain unit 162B immediately adjacent to the first chain unit 162A. The first chain unit 162A includes a first pivot portion 164A. The second chain unit 162B includes a second pivot portion 164B pivotably and movably connected to the first pivot portion 164A. In the present embodiment, the second pivot portion 164B is fitted onto the first pivot portion 164A (i.e., the second pivot portion 164B extends around the first pivot portion 164A).

As shown in FIGS. 4 and 5, in some embodiments, the second pivot portion 164B has an opening. The first pivot portion 164A includes a pin rotatably and slidably located in the opening of the second pivot portion 164B. In some embodiments, a maximum width of the opening of the second pivot portion 164B is greater than a maximum width of the pin of the first pivot portion 164A, such that the pin can slide inside the opening to change the relative positions of the first chain unit 162A and the second chain unit 162B.

As shown in FIGS. 4 and 5, the hinge device 120 further includes at least one elastic padding E (represented by dots in FIG. 5) disposed in at least one of the chain units 162. The elastic padding E can block particles and moisture from entering the chains 160A and 160B, thereby prolonging the lifespan of the hinge device 120. In addition, as the relative positions of the frames 101 and 102 are changed via rotation, the elastic padding E may elastically deform and thereby change the distance between two immediately adjacent chain units 162. As a result, the chains 160A and 160B may expand or contract to adjust the radials positions of the frames 101 and 102, thereby facilitating the unfolding and folding of the flexible components 111 and 112.

As shown in FIGS. 4 and 5, in some embodiments, the elastic padding E is configured to contact two immediately adjacent chain units 162 (e.g., the first chain unit 162A and the second chain unit 162B). In some embodiments, the hinge device 120 includes a plurality of the elastic paddings E. Each of the elastic paddings E is disposed between the first pivot portion 164A and the second pivot portion 164B of a pair of immediately adjacent chain units 162. Each of the elastic paddings E contacts at most two chain units 162, and any two elastic paddings E are spaced apart from each other. In some embodiments, the elastic padding E fills in the opening of the second pivot portion 164B and wraps around the pin of the first pivot portion 164A.

In some embodiments, the elastic padding E includes one or more organic polymer materials. In some embodiments, the elastic padding E includes organic polymer material whose main chain includes a C—C bond(s) or siloxane (Si—O—Si). In some embodiments, the organic polymer material includes functional groups such as a methyl group (s) ($CH_3$) or a fluorine-based molecule group(s) attached to a carbon atom or a silicon atom. Said material is hydrophobic, making it harder for moisture to enter the chains 160A and 160B.

Figure 6:
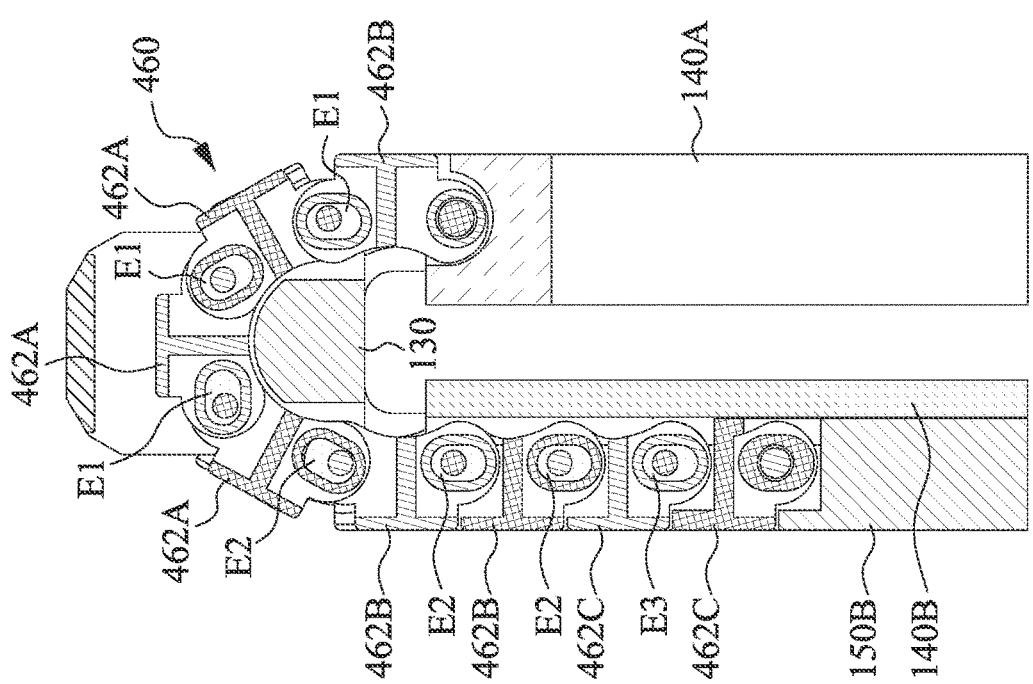
FIG. 6 illustrates a sectional view of a folded hinge device in accordance with another embodiment of the present disclosure.

Reference is made to FIG. 6. In the present embodiment, the chain 460 of the hinge device 420 is filled with two or more different elastic paddings to control the motion and the curvature of the chain 460.

As shown in FIG. 6, in some embodiments, the chain units of the chain 460 are categorized into at least a first group and a second group. The chain units of the first group are positioned around the shaft 130 when the foldable electronic device or the hinge device 420 is folded. The second group adjoins the first group. The hinge device 420 includes a first elastic padding E1 and a second elastic padding E2. The first elastic padding E1 is disposed in the one or more chain units 462A of the first group. The second elastic padding E2 is disposed in the one or more chain units 462B of the second group. An elastic modulus of the first elastic padding E1 is lower than an elastic modulus of the second elastic padding E2 (e.g., the first elastic padding E1 and the second elastic padding E2 may include different materials). In the present embodiment, the first elastic padding E1 is disposed in the opening of the pivot portion of the chain unit 462A, and the second elastic padding E2 is disposed in the opening of the pivot portion of the chain unit 462B.

As shown in FIG. 6, the chain units 462A of the first group make up the curved portion of the chain 460 around the shaft 130. Arranging the first elastic padding E1, which has a relatively low elastic modulus, in the chain units 462A of the first group enables the chain 460 to smoothly expand and curve into an arc around the shaft 130 when the hinge device 420 is folded. The second elastic padding E2, which has a relatively high elastic modulus, is disposed in the one or more chain units 462B of the second group next to the first group, such that the second group can serve as a "fulcrum" to help stress transmit to the chain units 462A of the first group when the hinge device 420 is folded, thereby enabling the section of the chain 460 made up by the chain units 462A of the first group to smoothly expand and curve into an arc.

As shown in FIG. 6, in some embodiments, the chain units of the chain 460 are categorized into the first group, the second group, and a third group. The second group is located between the first group and the third group. The hinge device 420 further includes a third elastic padding E3. The third elastic padding E3 is disposed in the one or more chain units 462C of the third group. An elastic modulus of the third elastic padding E3 is lower than the elastic modulus of the second elastic padding E2 and is higher than the elastic modulus of the first elastic padding E1 (e.g., the third elastic padding E3 may include material different from those of the first elastic padding E1 and the second elastic padding E2). In some embodiments, the chain units 462C of the third group are arranged linearly on a side of the rotating component 140B.

The chain units 462C of the third group may serve as an extending section of the chain 460, providing the chain 460 with extra extension as the hinge device 420 is folded or unfolded, if desired.

In some embodiments, the first elastic padding E1 has a Young's modulus of less than 50 N/mm$^2$ and an elongation of less than 1000%, the second elastic padding E2 has a Young's modulus of more than 150 N/mm$^2$ and an elongation of less than 500%, and the third elastic padding E3 has a Young's modulus ranging from 50 to 150 N/mm$^2$ and an elongation ranging from 1000% to 1500%.

Figure 7:
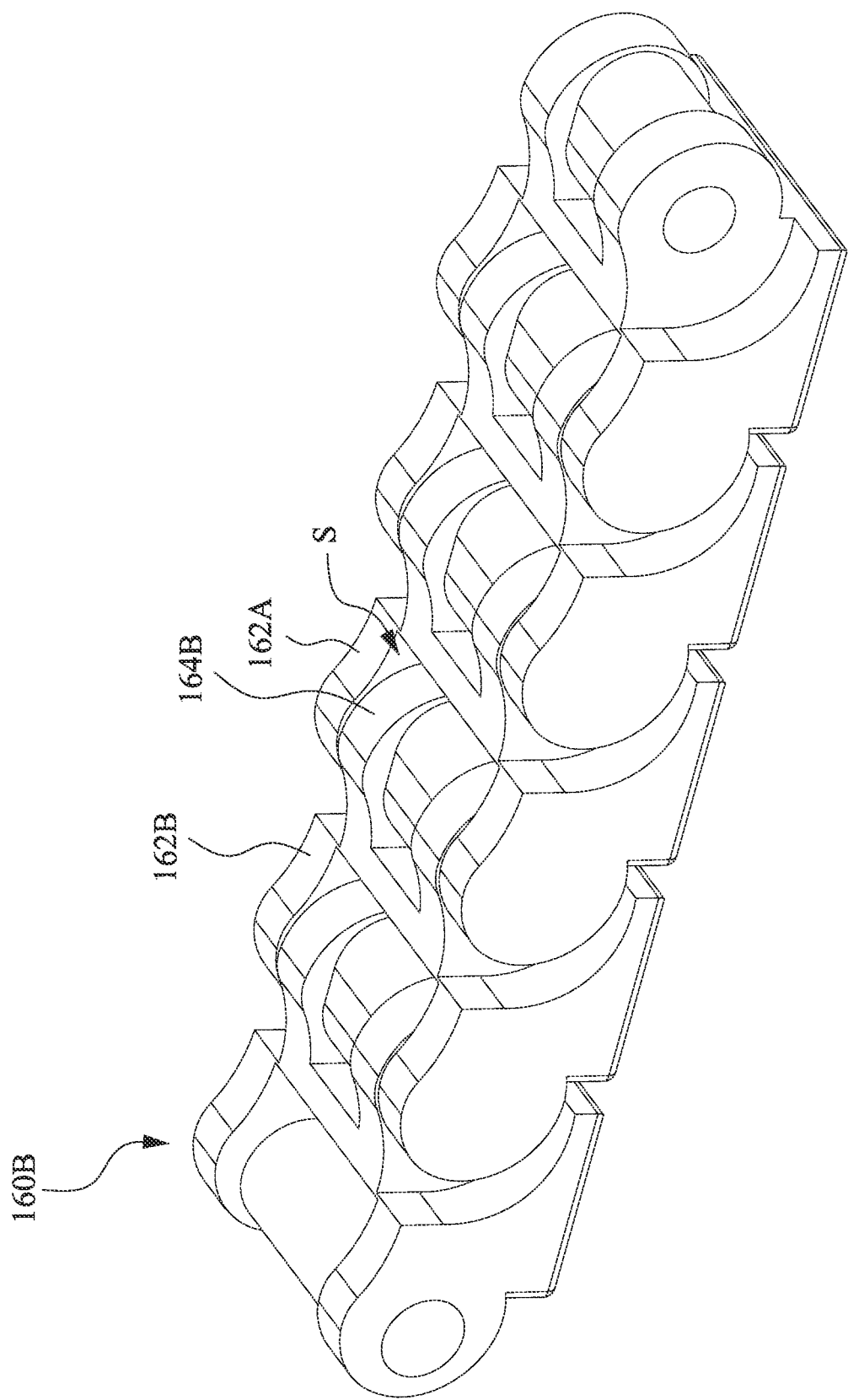
FIG. 7 illustrates a perspective view of a chain for a hinge device in accordance with another embodiment of the present disclosure.
Figure 8:
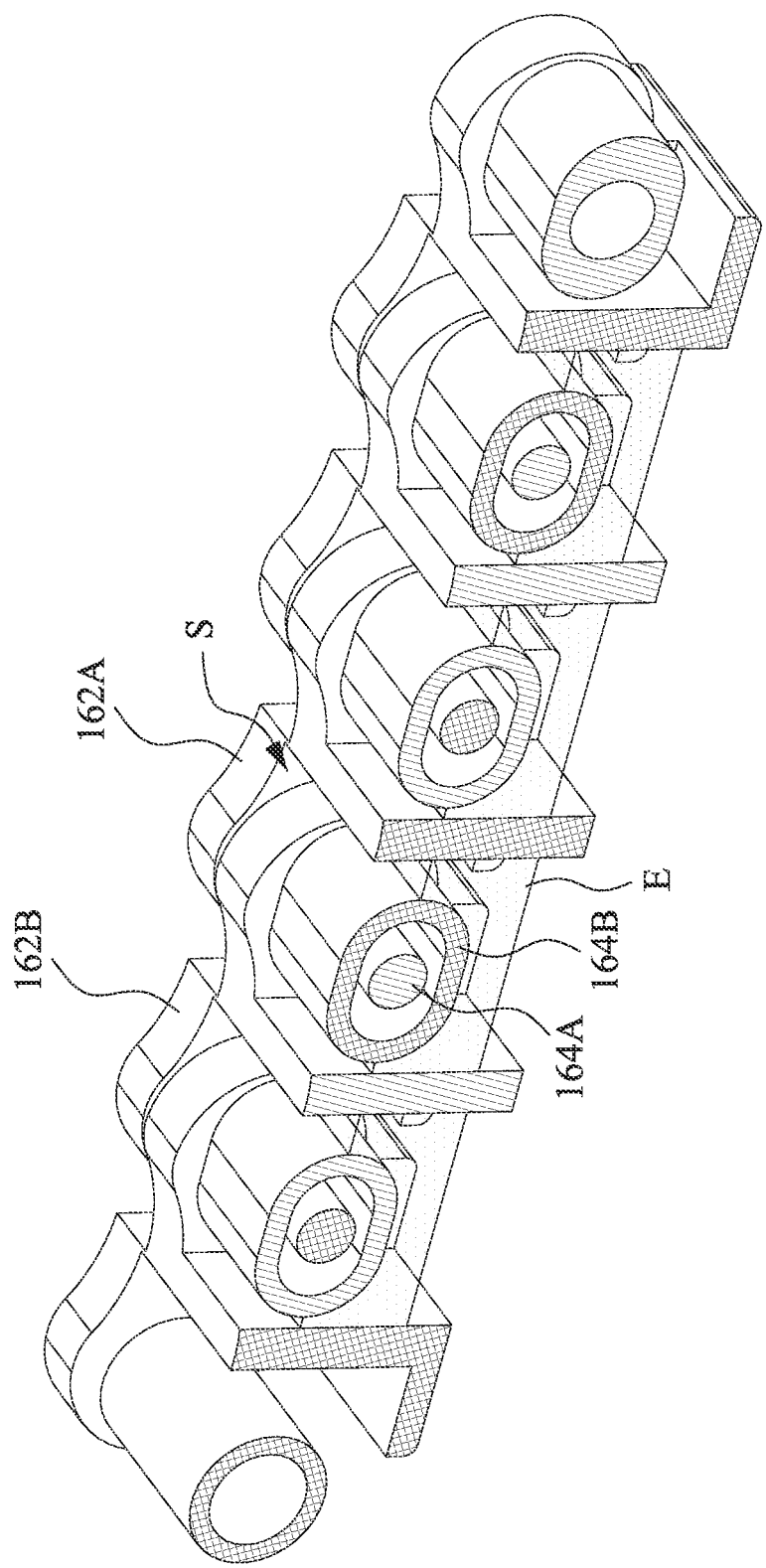
FIG. 8 illustrates a sectional view of the chain shown in FIG. 7.

Reference is made to FIGS. 7 and 8. The present embodiment differs from the embodiments discussed previously in that the elastic padding E is disposed in a recess S of the first chain unit 162A. The recess S is configured to receive the second pivot portion 164B of the second chain unit 162B. The elastic padding E, which is filled in the recess S, at least partially covers the second pivot portion 164B and contacts at least one sidewall of the recess S. In some embodiments, the first pivot portion 164A includes a pin connected between two opposite sidewalls of the recess S and extending through the second pivot portion 164B. The elastic padding E at least partially covers a surface of the second pivot portion 164B away from the pin of the first pivot portion 164A. In some embodiments, both the recess S and the gap between the first pivot portion 164A and the second pivot portion 164B may be filled with elastic padding E.

In some embodiments, the hinge device includes a plurality of elastic paddings E. The elastic paddings E are each disposed in the recess S of one of the chain units of the chain 160B and are spaced apart from one another. In some embodiments, the chain units of the chain 160B may be categorized into multiple groups, and the chain units of each group have their recesses S filled with different elastic paddings. For example, the recesses S of the chain units may be filled with the first elastic padding E1, the second elastic padding E2, and the third elastic padding E3 in accordance with the padding pattern discussed above with reference to FIG. 6.

Figure 9:
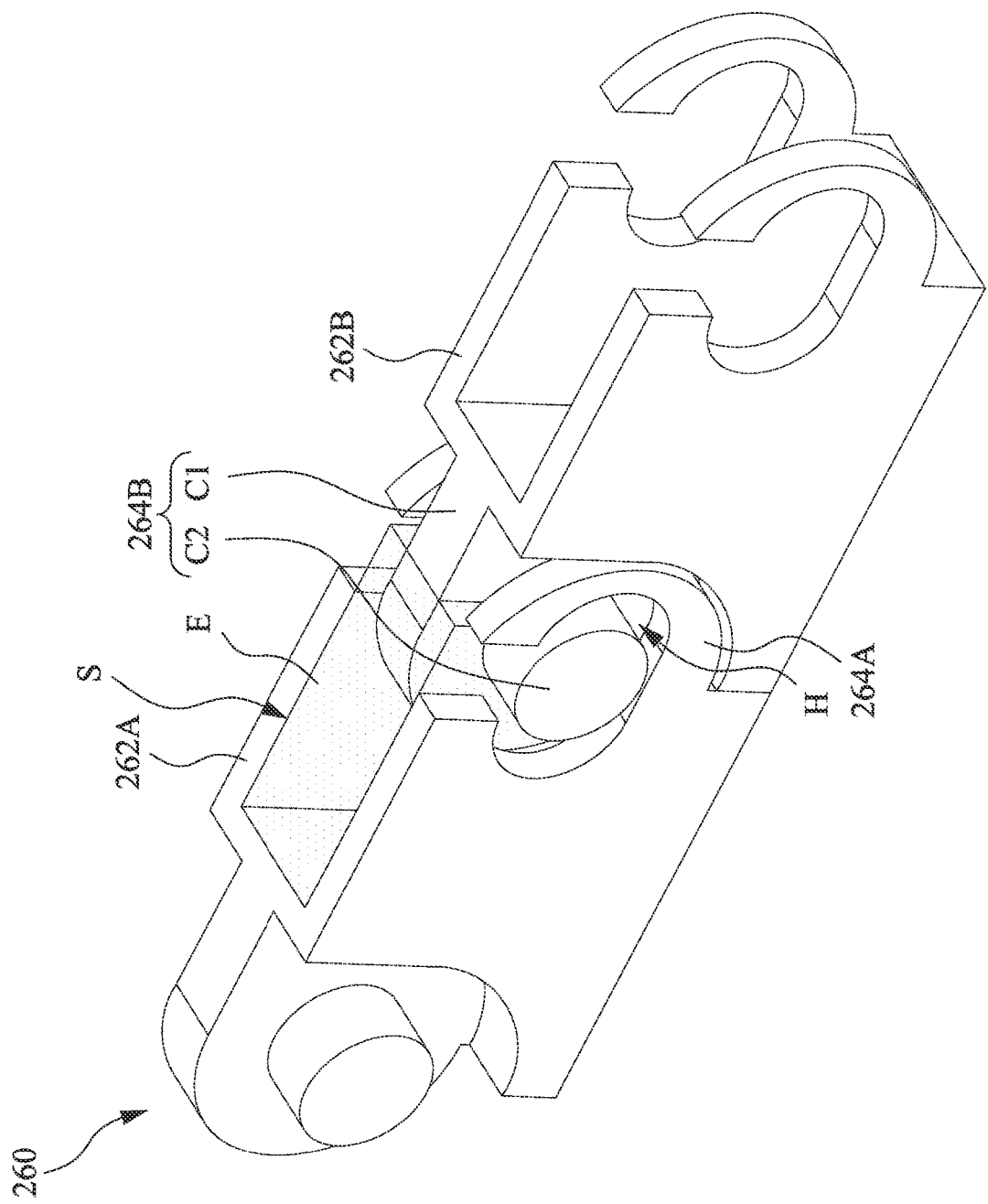
FIG. 9 illustrates a perspective view of a chain for a hinge device in accordance with another embodiment of the present disclosure.

Reference is made to FIG. 9. The present embodiment differs from the embodiments discussed previously in that the second pivot portion 264B of the second chain unit 262B movably extends through the first pivot portion 264A of the first chain unit 262A. Specifically, the second pivot portion 264B includes an extending structure C1 and at least one protrusion C2. The extending structure C1 extends into the recess S of the first chain unit 262A. The protrusion C2 is disposed on at least one side surface of the extending structure C1. The first pivot portion 264A includes an opening H formed on at least one sidewall of the recess S. The protrusion C2 of the second pivot portion 264B is rotatably and slidably located in the opening H. The opening H of the first pivot portion 264A may be "open" (i.e., having a notch), as shown in FIG. 9. Alternatively, the opening H may be "closed" (i.e., without a notch). In some embodiments, the elastic padding E is disposed in the recess S and covers an end of the extending structure C1 of the second pivot portion 264B. In some embodiments, the elastic padding E may further contact the protrusion C2 of the second pivot portion 264B.

Figure 10:
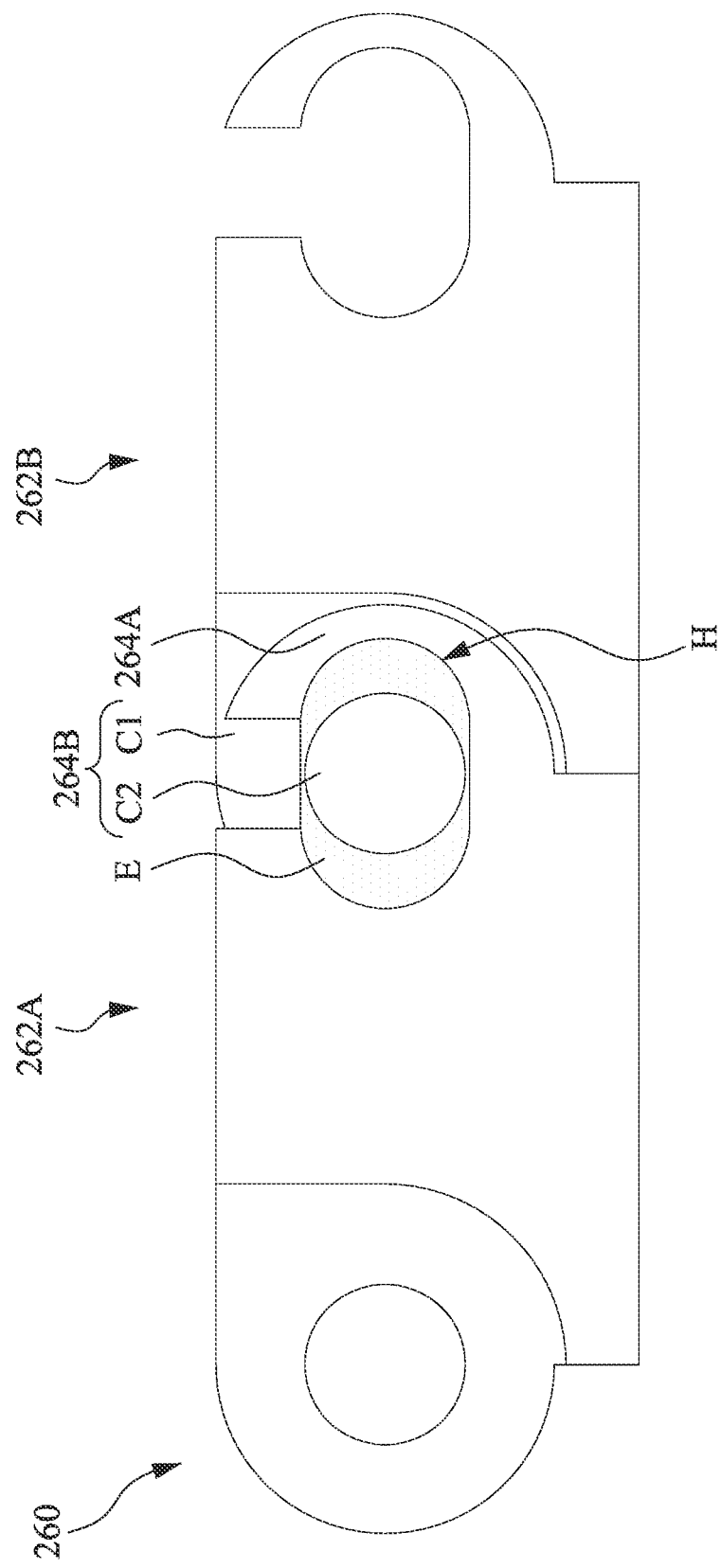
FIG. 10 illustrates a side view of a chain for a hinge device in accordance with another embodiment of the present disclosure.

Reference is made to FIG. 10. The present embodiment differs from the embodiment shown in FIG. 9 in that the elastic padding E is disposed between the first pivot portion 264A and the second pivot portion 264B. In some embodiments, the elastic padding E fills in the opening H of the first pivot portion 264A and wraps around the protrusion C2 of the second pivot portion 264B. In some embodiments, both the recess S of the first chain unit 262A and the gap between the first pivot portion 264A and the second pivot portion 264B may be filled with elastic padding E.

Figure 11:
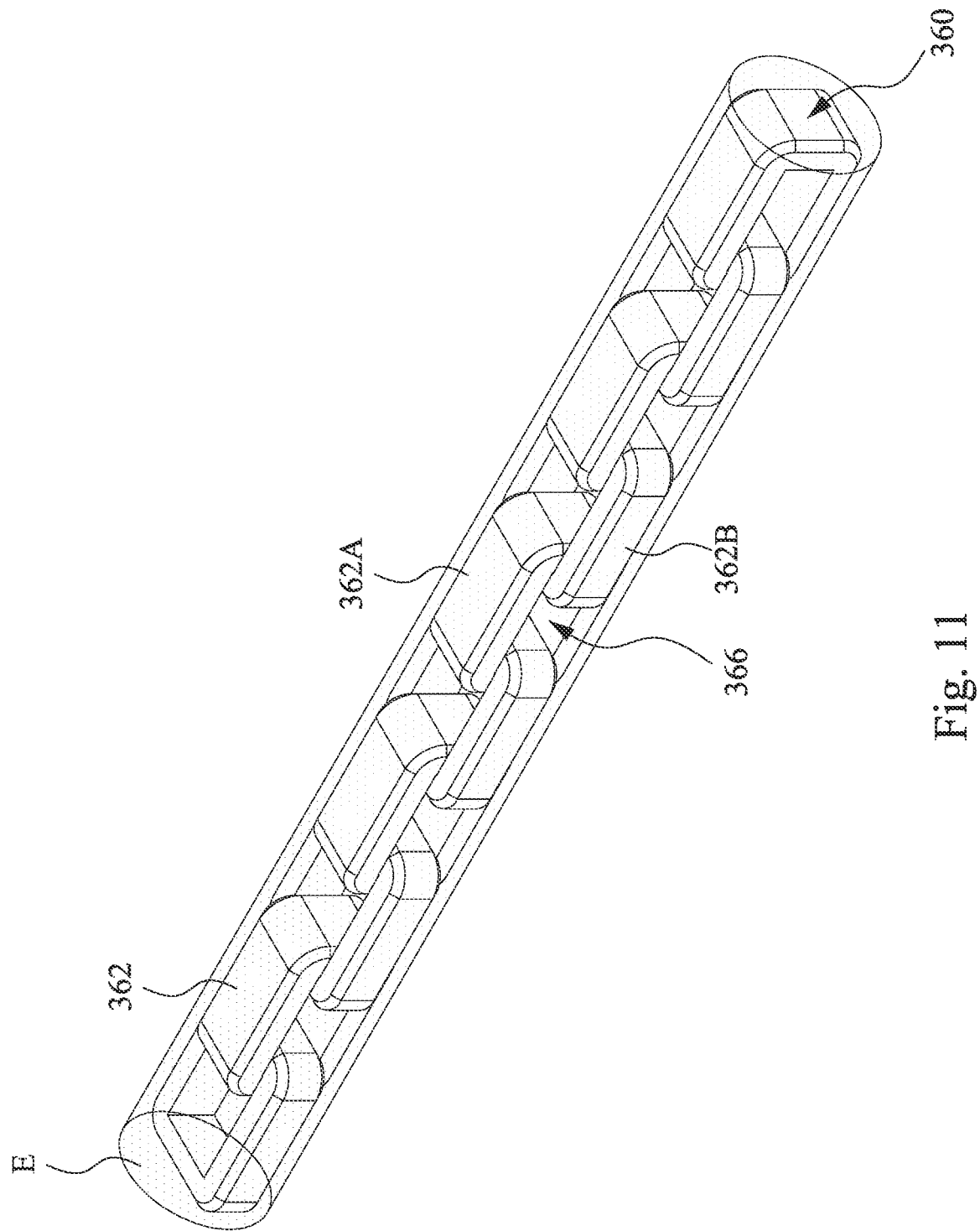
FIG. 11 illustrates a perspective view of a chain for a hinge device in accordance with another embodiment of the present disclosure.

Reference is made to FIG. 11. The present embodiment differs from the embodiments discussed previously in that the elastic padding E encapsulates at least one chain unit 362 of the chain 360. In some embodiments, the chain 360 includes a first chain unit 362A and a second chain unit 362B immediately adjacent to the first chain unit 362A. The first chain unit 362A has a thru-hole 366. The second chain unit 362B extends through the thru-hole 366 and thereby interlocks with the first chain unit 362A. The elastic padding E covers a surface of the first chain unit 362A away from the thru-hole 366 and fills in the thru-hole 366. The space in the thru-hole 366 not occupied by immediately adjacent chain units may be filled up with the elastic padding E.

In some embodiments, the chain units 362 of the chain 360 are closed ring structures. In some embodiments, the chain units 362 of the chain 360 may be categorized into multiple groups, and the chain units of different groups may be encapsulated by different elastic paddings. For example, the chain units 362 may have multiple sections encapsulated by the first elastic padding E1, the second elastic padding E2, and the third elastic padding E3 respectively in accordance with the padding pattern discussed above with reference to FIG. 6.

Figure 12:
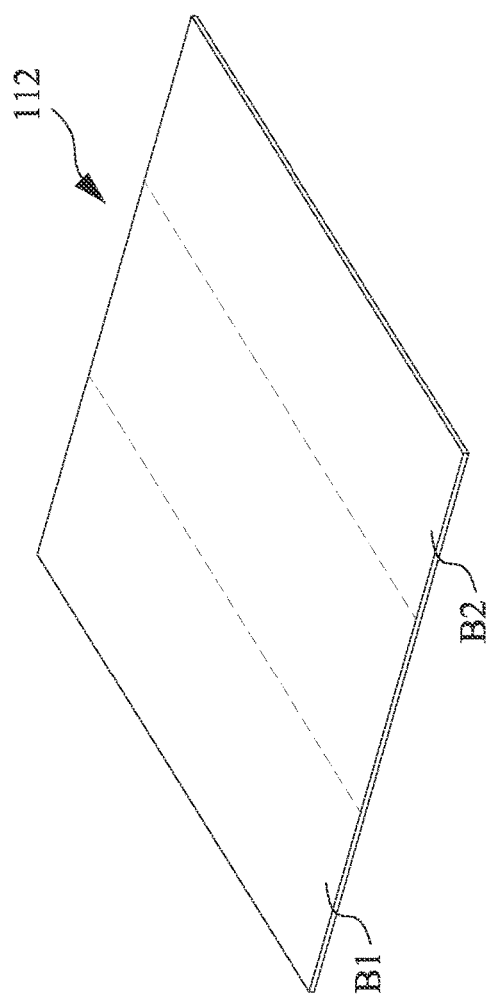
FIG. 12 illustrates an exploded view of a foldable electronic device in accordance with another embodiment of the present disclosure, in which the foldable electronic device is unfolded.
Figure 12:
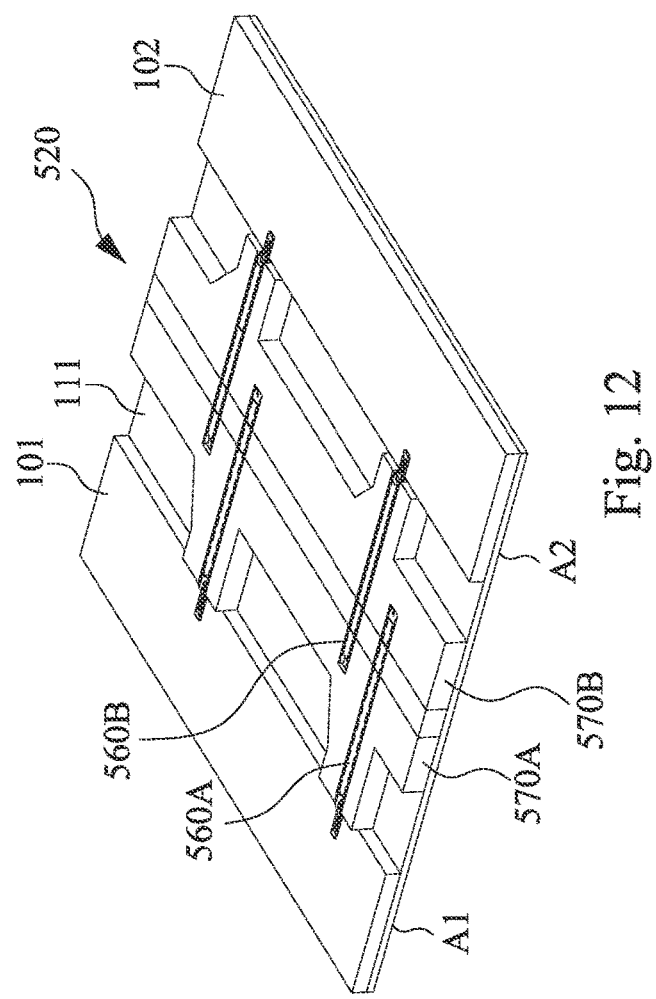

Reference is made to FIG. 12. The present embodiment differs from the embodiment shown in FIG. 1 in that the hinge device 520 of the foldable electronic device 500 includes a chain 560A directly connected to the frame 101 and a chain 560B directly connected to the frame 102. The hinge device 520 further includes at least one elastic padding (not depicted) disposed in at least one chain unit of the chains 560A and 560B, or encapsulating at least one chain unit of the chains 560A and 560B. The configuration of the chains 560A and 560B and the elastic padding may be similar to any of the embodiments discussed above. For further details, please refer to related passages above.

In some embodiments, the hinge device 520 further includes two supports 570A and 570B. The chains 560A and 560B are disposed on the supports 570A and 570B, respectively. In some embodiments, an end of the chain 560A away from the frame 101 is connected to the support 570B, and an end of the chain 560B away from the frame 102 is connected to the support 570A.

In sum, the foldable electronic device of the present disclosure includes a hinge device having a chain and at least one elastic padding, with the elastic padding being disposed in part or all of the chain or encapsulating part or all of the chain. This simple structure enables the hinge device to guide the folding and unfolding of the flexible component of the foldable electronic device (e.g., a flexible display panel or a flexible cover plate). In addition, the elastic padding can block particles and moisture from entering the chain, thereby prolonging the lifespan of the hinge device.

Although the present disclosure has been described by way of the exemplary embodiments above, the present disclosure is not to be limited to those embodiments. Any person skilled in the art can make various changes and modifications without departing from the spirit and the scope of the present disclosure. Therefore, the protective scope of the present disclosure shall be the scope of the claims as attached.

What is claimed is:

1. A foldable electronic device, comprising:
a frame;
a flexible component disposed on the frame; and
a hinge device, comprising:
   a chain connected to the frame and comprising a plurality of chain units, wherein the chain units comprise a first chain unit and a second chain unit, the first chain unit comprises a first pivot portion, the second chain unit comprises a second pivot portion movably connected to the first pivot portion, and the first chain unit has a recess for receiving the second pivot portion; and
   at least one elastic padding disposed at least one of in the recess of the first chain unit or between the first pivot portion and the second pivot portion,
   wherein the second pivot portion has an opening, the first pivot portion comprises a pin, the pin is rotatably and slidably located in the opening, and the elastic padding fills in the opening and wraps around the pin.

2. The foldable electronic device of claim 1, wherein the pin extends through the second pivot portion, and the elastic padding further at least partially covers a surface of the second pivot portion away from the pin.

3. The foldable electronic device of claim 1, wherein the at least one elastic padding is plural in number, each of the elastic paddings is disposed in one of the chain units, and the elastic paddings are spaced apart from one another.

4. The foldable electronic device of claim 1, wherein the elastic padding comprises one or more organic polymer materials.

5. The foldable electronic device of claim 1, wherein the chain units of the chain are categorized into at least a first group and a second group, the second group adjoins the first group, the at least one elastic padding comprises a first elastic padding and a second elastic padding, the first elastic padding is disposed in the chain units of the first group, the second elastic padding is disposed in the chain units of the second group, and an elastic modulus of the first elastic padding is lower than an elastic modulus of the second elastic padding.

6. The foldable electronic device of claim 5, wherein the chain units of the chain are categorized into the first group, the second group, and a third group, the second group is located between the first group and the third group, the at least one elastic padding comprises a third elastic padding, the third elastic padding is disposed in the chain units of the third group, and an elastic modulus of the third elastic padding is lower than the elastic modulus of the second elastic padding and is higher than the elastic modulus of the first elastic padding.

7. A foldable electronic device, comprising:
a frame;
a flexible component disposed on the frame; and
a hinge device, comprising:
   a chain connected to the frame and comprising a plurality of chain units; and
   at least one elastic padding encapsulating at least one of the chain units and comprising one or more organic polymer materials,
   wherein the chain units comprise a first chain unit and a second chain unit, the first chain unit has a thru-hole, the second chain unit extends through the thru-hole, and the elastic padding covers a surface of the first chain unit away from the thru-hole and fills in the thru-hole.

8. The foldable electronic device of claim 7, wherein the one or more organic polymer materials comprise an organic polymer material having main chain that comprises a C—C bond.

9. The foldable electronic device of claim 7, wherein the one or more organic polymer materials comprise an organic polymer material having main chain that comprises siloxane.

10. The foldable electronic device of claim 7, wherein the one or more organic polymer materials comprise an organic polymer material comprising a methyl group.

11. The foldable electronic device of claim 7, wherein the one or more organic polymer materials comprise an organic polymer material comprising a fluorine-based molecule group attached to a carbon atom.

12. The foldable electronic device of claim 7, wherein the one or more organic polymer materials comprise an organic polymer material comprising a fluorine-based molecule group attached to a silicon atom.

13. The foldable electronic device of claim 7, wherein the elastic padding comprises a first elastic padding encapsulating the first chain unit and a second elastic padding encapsulating the second chain unit, and an elastic modulus of the first elastic padding is different than an elastic modulus of the second elastic padding.

14. A foldable electronic device, comprising:
a frame;
a flexible component disposed on the frame; and
a hinge device, comprising:
   a chain connected to the frame and comprising a plurality of chain units, wherein the chain units comprise a first chain unit and a second chain unit, the first chain unit comprises a first pivot portion, the second chain unit comprises a second pivot portion movably connected to the first pivot portion, and the first chain unit has a recess for receiving the second pivot portion; and
   at least one elastic padding disposed at least one of in the recess of the first chain unit or between the first pivot portion and the second pivot portion,
   wherein the first pivot portion comprises a pin extending through the second pivot portion, and the elastic padding at least partially covers a surface of the second pivot portion away from the pin.

15. The foldable electronic device of claim 14, wherein the elastic padding comprises one or more organic polymer materials.

16. The foldable electronic device of claim 14, wherein elastic padding comprises a first elastic padding disposed in the recess of the first chain unit and a second elastic padding disposed in a recess of the second chain unit, and an elastic modulus of the first elastic padding is different than an elastic modulus of the second elastic padding.

17. A foldable electronic device, comprising:
   a frame;
   a flexible component disposed on the frame; and
   a hinge device, comprising:
      a chain connected to the frame and comprising a plurality of chain units, wherein the chain units comprise a first chain unit and a second chain unit, the first chain unit comprises a first pivot portion, the second chain unit comprises a second pivot portion movably connected to the first pivot portion, and the first chain unit has a recess for receiving the second pivot portion; and
      at least one elastic padding disposed at least one of in the recess of the first chain unit or between the first pivot portion and the second pivot portion,
      wherein the first pivot portion has an opening located on a sidewall of the recess, the second pivot portion comprises an extending structure and a protrusion, the extending structure extends into the recess, the protrusion is disposed on a side of the extending structure and is rotatably and slidably located in the opening, and the elastic padding is configured to at least one of cover an end of the extending structure or fill in the opening and wrap around the protrusion.

18. The foldable electronic device of claim 17, wherein the elastic padding comprises one or more organic polymer materials.

19. The foldable electronic device of claim 18, wherein the one or more organic polymer materials comprise an organic polymer material having main chain that comprises a C—C bond or siloxane.

20. The foldable electronic device of claim 18, wherein the one or more organic polymer materials comprise an organic polymer material comprising a methyl group or a fluorine-based molecule group attached to a carbon atom.

* * * * *